United States Patent [19]

Yeasting

[11] 4,333,050
[45] Jun. 1, 1982

[54] MULTIPHASE VOLTAGE MONITOR

[76] Inventor: Maynard C. Yeasting, 17967 W. Portage, Elmore, Ohio 43416

[21] Appl. No.: 124,768

[22] Filed: Feb. 26, 1980

[51] Int. Cl.³ .................. G01R 19/00; G08B 21/00; H02H 3/20
[52] U.S. Cl. ............................ 324/107; 324/119; 324/133; 340/661; 361/90
[58] Field of Search ............... 324/107, 108, 86, 119, 324/133; 340/660–663; 361/33, 47, 88, 90, 91, 92

[56] References Cited

U.S. PATENT DOCUMENTS 3,525,019  8/1970  Lansch .................. 361/88

FOREIGN PATENT DOCUMENTS 611270  5/1978  U.S.S.R. .................. 361/33

Primary Examiner—Ernest F. Karlsen

[57] ABSTRACT

A monitor for a polyphase power line continuously compares the voltage on each phase of the power line with reference voltages that are selected percentages above and below the average of the power line voltages to detect voltage unbalance and with fixed voltages to detect high or low voltage conditions. The monitor is also responsive to phase sequence.

7 Claims, 4 Drawing Figures

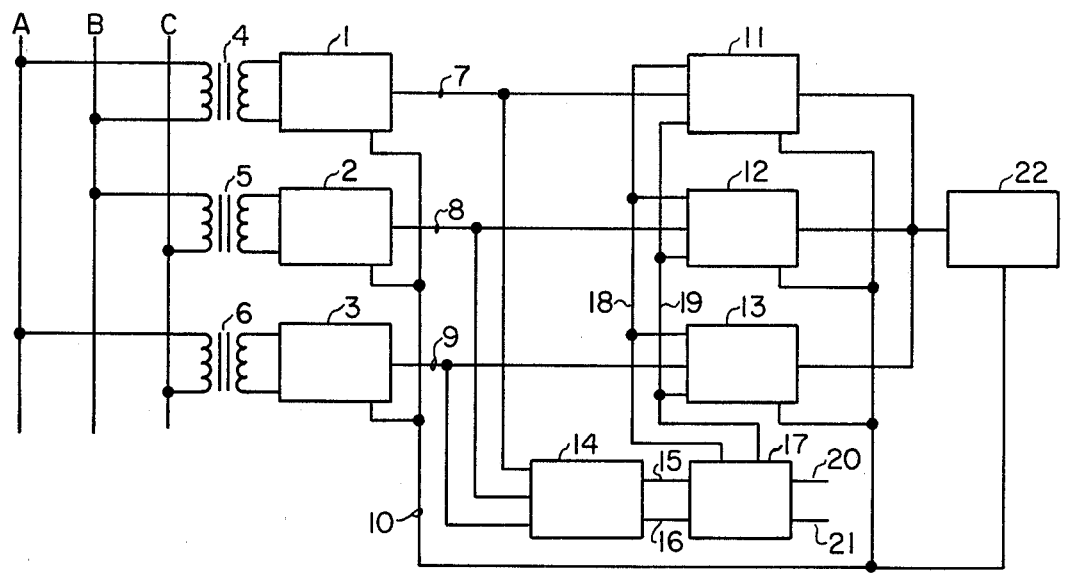
Fig. I
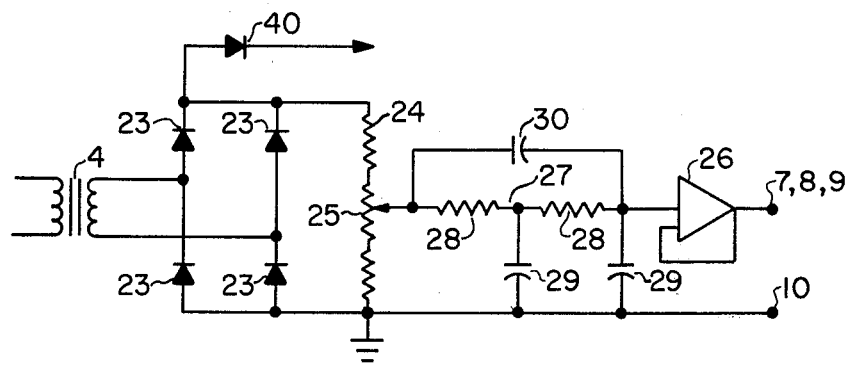
Fig. II
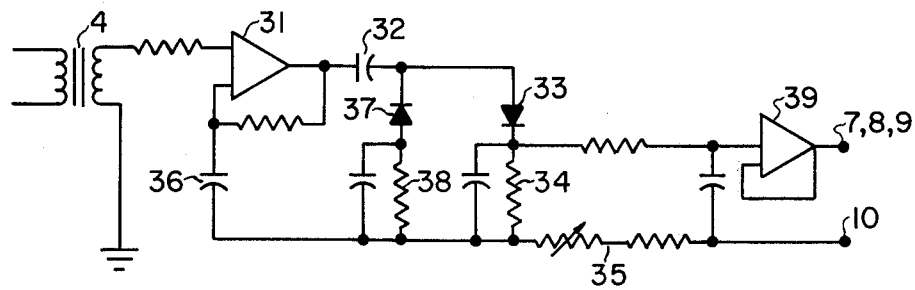
Fig. III

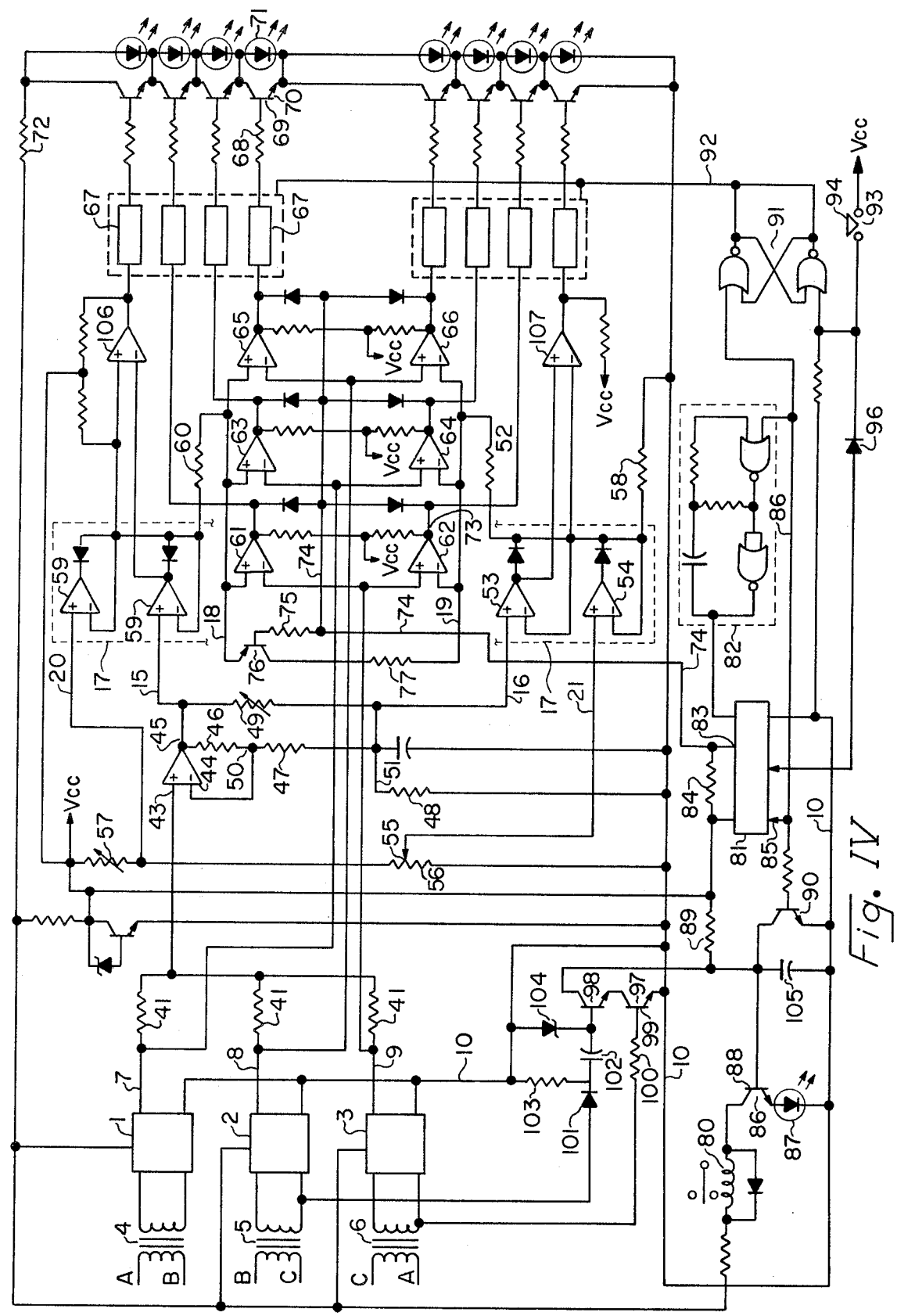
Fig. IV

MULTIPHASE VOLTAGE MONITOR

BACKGROUND OF THE INVENTION

Manufacturers of polyphase motors specify the range of operating voltages and the amount of voltage unbalance that may be tolerated by the motors. Voltage unbalance, a condition in which the various phase voltages are unequal, causes wasteful heating in the rotor windings of a conventional squirrel cage motor. This can occur even though all of the phase voltages are within generally accepted voltage limits.

Various circuits have been proposed and are used to monitor multiphase power lines. Some of these, using multiphase full wave rectifiers, are responsive to changes in the ripple voltage of the rectifiers. Others compare part, usually half, of the line to line voltage of one phase with a phase shifted portion of another line to line voltage. These circuits, both rectifier ripple voltage and phase shift circuits are quite satisfactory if the voltage wave forms are pure sine waves. They are not satisfactory if the voltages being monitored are distorted, i.e. include harmonics of the fundamental voltage. The harmonics cause tripping on types of unbalance which do no harm to the motors. Monitors responsive to the ripple voltage of rectifiers connected to the lines being monitored are also responsive to or affected by the type of unbalance, thus tripping at differing amounts of unbalance depending upon the type of unbalance occurring.

BRIEF SUMMARY OF THE INVENTION

A monitor constructed according to the invention comprises AC to DC converters to change the multiphase voltages to corresponding DC voltages, a limit voltage generator that provides a high limit voltage and a low limit voltage that are selectable percentages above and below the average of the outputs of the converters, limit comparators connected to the limit voltage outputs and to the converters, and indicating means connected to the comparators to be activated when the output of a converter is outside the voltage range defined by the limit generator. Auxiliary indicating equipment connected to the comparators may be provided to identify the phase that is out of limit and, if desired, to retain the phase identification. Likewise a timer may be included to delay the response to an unbalance or out of limit voltage condition. The improved monitor evaluates the unbalance according to the National Electrical Manufacturers Association (N.E.M.A.) formula for unbalance, i.e. the unbalance equals the maximum deviation of a phase voltage from the average voltage divided by the average voltage.

A preferred embodiment of the invention is illustrated in the accompanying drawings. In the drawings:

FIG. I is a block diagram of the improved monitor.

FIG. II is a diagram of a preferred form of AC-DC converter.

FIG. III is a diagram of an alternative form of AC-DC converter.

FIG. IV is a diagram of a monitor comprising AC to DC converters, a preferred form of limit voltage generator, limit comparators, a timer, and latching indicator circuits.

These specific figures and the accompanying description are intended merely to illustrate the invention and not to impose limitations on its scope.

DESCRIPTION OF A PREFERRED EMBODIMENT

Referring to FIG. I, a multiphase power line represented by a three phase three wire line A-B-C is connected to separate AC-DC converters 1, 2, and 3 through isolation transformers 4, 5, and 6. Each of the converters includes a rectifier, either half wave or full wave, and a filter so that the DC output voltages on leads 7, 8, and 9 with respect to the voltage on a ground or common lead 10 are proportional to the line to line voltages between lines A, B, and C to which the converters are connected.

The converters 1, 2, and 3 are connected to individual limit comparators 11, 12, and 13 and to a limit voltage generator 14. The limit voltage generator 14 averages the voltages on leads 7, 8, and 9 and delivers limit voltages on leads 15 and 16 that are given percentages higher and lower than the average of the converter voltages on leads 7, 8, and 9. These limit voltages are passed through a voltage sensitive switch 17 to leads 18 and 19 connected to the limit comparators 11, 12, and 13. High and low standard voltages are applied to the switch through leads 20 and 21. The voltage sensitive switch is a form of "auction" circuit that maintains the low reference voltage on lead 19 at the greater of the voltage from the limit generator 14 or the standard low voltage and maintains the high limit voltage on lead 18 at the lower of the high limit voltage on lead 15 or the standard high voltage limit on lead 20. The voltage sensitive switch is an option and is used only if the monitor is to respond to high or low voltage in addition to responding to unbalance.

The limit comparators 11, 12, and 13 each include means for indicating when the voltage on the input leads 7, 8, or 9 exceeds the voltage on the high reference lead 18 or is less than the voltage on the low reference lead 19, i.e. when one phase voltage differs by more than a given percentage from the average (unbalance) or is below a low voltage limit or above a high voltage limit.

Suitable AC-DC converters are illustrated in FIGS. II and III. FIG. II shows a conventional full wave bridge rectifier comprising diodes 23 supplying raw full wave rectified voltage to a voltage divider 24. Two of the converters 1, 2, or 3 include a potentiometer 25 as part of the voltage divider. The output of the potentiometer 25 or voltage divider 24 is connected to a voltage follower op-amp 26 by way of a two stage RC filter 27 comprising series resistors 28 and shunt capacitors 29. The output of the voltage divider 24 consists of a DC voltage equal to the average of the half sine wave voltage from the rectifier plus AC components at even multiples of the power line frequency. Since the phase of the AC components is shifted approximately 90° per section the AC components at the output of the filter may be partially cancelled by connecting a small capacitor 30 across the filter. The potentiometers 25 allow the conversion ratios of the converters to be equalized.

As an alternative, a precision rectifier, FIG. III, such as is often used as an AC to DC converter in a digital voltmeter, may be used. Such a converter comprises an op-amp 31 the output of which is connected to ground by way of a series circuit comprising a capacitor 32, a diode 33, a resistor 34, and an adjustable resistor 35. The voltage developed across the adjustable resistor 35 is applied, as a feedback, through capacitor 36 to the inverting input of the op-amp 31. A second diode 37 and resistor 38 are connected in inverse parallel to the first diode 33 and resistor 34. The DC output appearing across resistor 34 is filtered and applied to an op-amp 39 connected as a voltage follower to supply the output lead 7, 8, or 9.

The converter circuit of FIG. II is preferred because of its simplicity even though no compensation is made for the error introduced by the voltage drop through the diodes. The FIG. II circuit can also supply power for the amplifiers through a diode 40.

Referring to FIG. IV, the outputs 7, 8, and 9 of the converters 1, 2, and 3 are connected through equal valued resistors 41 to a non-inverting input 43 of an op-amp 44. Output lead 45 (lead 15 FIG. I) is connected to circuit ground 10 through a resistor network comprising resistors 46,47, and 48 connected in series. A variable resistor 49 is connected in parallel with resistors 46 and 47. Junction 50 between resistors 46 and 47 is connected to the inverting input of op-amp 44.

The op-amp 44 and the associated resistors form the limit voltage generator 14 (FIG. I). On the input side the voltage at input 43 is the average of the converter output voltages. On the output side the voltage on output 45 is the high limit voltage; junction 50 is at the average voltage, and the voltage at junction 51, lead 16 (FIG. I), is the low limit voltage for determining unbalance. The voltage span between the high limit and low limit is adjusted by variation of resistor 49. The voltage spans between the average and the limits are set by resistors 46 and 47. To operate according to the N.E.M.A. formula the resistors 46 and 47 are made equal to each other and several orders of magnitude greater than adjustable resistor 49. Neglecting the affect of resistors 46 and 47, the ratio of the resistances of resistors 49 and 48 is made equal to twice the percentage of unbalance divided by the quantity 100 minus the percentage unbalance.

Junction 51 (lead 16) is connected through a first section of the voltage sensitive switch 17 and a resistor 52 to lead 19 serving as the low limit terminal for the limit comparators 11, 12, and 13. The voltage sensitive switch or "auction" circuit comprises a pair of op-amps 53 and 54. Inverting inputs are connected to resistor 52 and the op-amp outputs are connected through diodes to the resistor 52. The non-inverting input of op-amp 53 is connected to lead 16 while the non-inverting input of op-amp 54 is connected to a slider 55 of a potentiometer 56 that is connected through rheostat 57 to a regulated voltage supply. The voltage on slider 55 serves as the low voltage limit. The op-amps 53,54 maintain the lead 19 at the higher of the voltages on lead 16 or slider 55. A resistor 58 serves as a "pull-down" resistor for the op-amps.

A similar circuit comprising op-amps 59 maintains the voltage to a resistor 60 and thus the lead 18 at the lower of the voltage on lead 15 or the voltage at the low side of rheostat 57.

The limit comparator 11 comprises a pair of voltage comparators 61, 62 (half of a LM339). Comparator 61 has its non-inverting input connected to high limit lead 18 and its inverting input to lead 7 (converter output) and to the non-inverting input of comparator 62. The inverting input of the latter is connected to lead 19. Similarly limit comparator 12 comprises comparators 63,64 and limit comparator 13 comprises comparators 65,66.

To indicate which of the comparators has responded to a fault, the output terminal of each comparator, using the comparator 65 as an example, is connected through a latch circuit 67 (one quarter of a CD4042) and resistor 68 to a base 69 of a transistor 70 that is connected in parallel with a light emitting diode 71. The L.E.D. 71 is one of a number connected in series between the ground lead 10 and a current limiting resistor 72 connected to a source of D.C. voltage. Each L.E.D. has a transistor connected in parallel. An L.E.D. is turned on by interrupting the current through the parallel transistor and is turned off by bypassing the current through the transistor. A total of eight light emitting diodes is used, six being connected to the comparators 61 through 66, and one to each section of the voltage sensitive switch 17. The latter two indicate whether a phase voltage is being compared to a voltage standard or to the average voltage.

To avoid oscillation the LM339 comparators require a small feedback signal to provide hysteresis or toggle action. This is provided by connecting each output, such as output 73, through a diode to a common lead 74. The lead 74 is connected through resistor 75 to a base of a PNP transistor 76 that is arranged to connect a resistor 77 between leads 18 and 19. Thus, whenever a comparator output goes low the transistor current flowing through resistors 52 and 60 raises the low limit voltage and lowers the high limit voltage, thus providing the feedback voltage.

To avoid response to short time or transient conditions the monitor incorporates a time delay circuit and a latch control circuit. Normally the latch circuits 67 are in transmitting condition so that the indicating L.E.D.s 71 continuously indicate the operating condition. When a fault or abnormal condition exists for a given time interval at output relay 80 is deenergized and the latches go to "hold".

To provide these features a timer consisting of a counter 81 (CD-4020) arranged to count the cycles of an oscillator 82 (half of a quad nor gate, CD4001) is included in the monitor. Reset pin 83 of the counter 81, which is held high (at reset) by resistor 84 connected to Vcc, is connected to common lead 74. The counter reset is driven low and the counter allowed to count whenever a comparator responds to unbalance or out-of-voltage limit condition. When a selected count is reached output 85 goes high. This through lead 86 stops the oscillator 82 to hold the count. The high signal on output 85 is also used to deenergize the output relay 80 that is energized as long as the monitored voltages are normal.

Relay 80 is energized through transistor 86 and L.E.D. 87 as long as base 88 receives current through resistor 89 connected to Vcc. This base current is shunted to ground through transistor 90 whenever the counter output goes high.

The latches 67 are controlled from a flip-flop 91 by way of lead 92. The flip-flop has its first or set input tied to the counter output 85 and is arranged so that latch control lead goes high when the counter output 85 goes high. A high on the latch control lead 92 puts the latches on "hold" to store the indications. The flip-flop 91 holds the indication, regardless of a clearing of the fault, until it is reset by momentarily closing contacts 93 of a reset pushbutton 94 to apply a high signal to its reset input. If desired, the flip-flop may be reset automatically by connecting the reset input through a diode 96 to an intermediate stage of the counter.

The monitor circuit automatically resets, except for reset of the flip-flop 91 and hence the indications, as soon as the monitored voltages return to normal. In the circuit, upon return to normal, lead 74 goes high to reset the counter 81, and the counter output 85 goes low to remove the shunt on the relay transistor drive. The operator may then reset the flip-flop to return the latch circuits to "transmit".

It is desirable when monitoring the voltage driving a polyphase motor to also monitor the phase sequence to ensure that the motor is not accidentally operated in reverse as a result of a transposition of power leads. In this monitor the phase sequence is monitored by a pair of transistors 97 and 98 that are connected in series between base 88 of the relay control transistor 86 and circuit ground 10. Transistor 97 has its base 99 connected through resistor 100 to one side of the secondary winding of transformer 6 so that transistor 97 is conducting during positive half cycles of one phase of the multiphase voltage system. The other transistor 98 draws base current through diode 101 and capacitor 102 from the secondary of transformer 5. A resistor 103 supplies a discharge path for the condenser. A low voltage zener 104 supplies a path for the capacitor current in the event transistor 97 is non-conducting.

In this arrangement the transistor 98 is conducting only during the first half of the positive half cycles of the voltage on transformer 5. If the voltage on transformer 5 lags the voltage on transformer 6 the conducting periods of the series transistors overlap and the transistors shunt the base current of the relay drive transistor 86 to chassis ground 10. If the phase sequence is reversed (correct sequence) no overlap occurs. A condenser 105 prevents chatter of the relay on incorrect phase sequence. Thus the relay 80 is deenergized immediately that a phase reversal occurs.

The monitor illustrated in FIG. IV provides an indication and trips a relay whenever any phase voltage of a multiphase system deviates from the average voltage of the system by a selectable amount or deviates beyond preset high and low voltage limits. The high and low voltage indications appear whenever the average voltage plus or minus the allowable deviation from the average exceeds the high voltage limit or is below the low voltage limit. Thus these indications may appear when the phase voltages are close to but still within the allowable limits.

If it is desired that the monitor respond to high and low average voltages rather than high and low phase voltages, the voltage sensitive switch 17 may be omitted, lead 15 tied to resistor 60 and lead 16 tied to resistor 52. The inputs to comparators 106 and 107, which are part of the indicating system for the voltage sensitive switch, are reconnected to compare the voltage at junction 50 (the average voltage) with the fixed high and low voltages at the low end of rheostat 57 and at the slider 55 of potentiometer 56. The outputs of the comparators 106 and 107 are also connected through diodes to the common lead 74 in order that the timer and relay control may respond to the high and low average voltage conditions.

I claim:
1. A voltage monitor for a multiphase electrical power supply comprising, in combination:
    (a) an AC to DC converter for each voltage being monitored,
    (b) a voltage limit generator that is connected to the converters and that has means for averaging the voltage outputs of the converters and delivering reference voltages that are selectable percentages above and below the average voltage,
    (c) a limit comparator connected to each converter and to the limit voltage generator for comparing the individual converter output with the reference voltages, and
    (d) utilization means connected to said comparators for signaling any excursion of a converter output voltage above the high reference voltage or below the low reference voltage.

2. A voltage monitor according to claim 1 in which the voltage limit generator includes a voltage averaging network, an op-amp connected to the network, and a series of resistors connected between the output of the op-amp and ground in which the voltage at an intermediate junction of the series is fed back to the op-amp input, the voltage at the op-amp output is the high reference voltage and the voltage at another intermediate junction is the low reference voltage.

3. A voltage monitor according to claim 2 that includes a variable resistor connected between the high and low reference voltage junctions for simultaneously adjusting the percentage by which the reference voltages depart from the average voltage.

4. A voltage monitor according to claim 2 including means connected between said reference voltage junctions and said voltage comparator inputs for changing the voltages at the comparator inputs in response to an output signal of a comparator.

5. A voltage monitor according to claim 1 including a voltage sensitive switch connected to a standard voltage source, to said limit voltage generator, and to said limit comparators, arranged to switch the comparators from the limit voltage generator to the standard voltage source according to the magnitude of the average voltage.

6. A voltage monitor according to claim 1 in which the utilization means includes a plurality of light emitting diodes connected in series, and means connected to said comparators for bypassing current around selected diodes according to the indication to be presented.

7. In a voltage monitor according to claim 1, a latch circuit connected between said comparators and said utilization means, and a timer connected to the comparators and the latch circuit arranged to actuate the latch circuit a predetermined time after a comparator signals a fault.

* * * * *